United States Patent
Lee

(10) Patent No.: US 9,466,766 B2
(45) Date of Patent: Oct. 11, 2016

(54) HIGH-EFFICIENCY ALGAINP LIGHT-EMITTING DIODE GROWN DIRECTLY ON TRANSPARENT SUBSTRATE AND MANUFACTURING METHOD THEREOF

(71) Applicant: AUK CORP., Iksan-si, Jeollabuk-do (KR)

(72) Inventor: Hyung Joo Lee, Gwangju (KR)

(73) Assignee: AUK CORP., Iksan-Si (KR)

( * ) Notice: Subject to any disclaimer, the term of this patent is extended or adjusted under 35 U.S.C. 154(b) by 0 days.

(21) Appl. No.: 14/335,383

(22) Filed: Jul. 18, 2014

(65) Prior Publication Data

US 2015/0091046 A1    Apr. 2, 2015

(30) Foreign Application Priority Data

Oct. 2, 2013   (KR) ........................ 10-2013-0117870

(51) Int. Cl.
*H01L 33/00* (2010.01)
*H01L 33/30* (2010.01)

(52) U.S. Cl.
CPC ........... *H01L 33/30* (2013.01); *H01L 33/0066* (2013.01)

(58) Field of Classification Search
CPC ........................ H01L 33/30; H01L 33/0066
See application file for complete search history.

(56) References Cited

U.S. PATENT DOCUMENTS

| | | | | |
|---|---|---|---|---|
| 8,692,286 B2* | 4/2014 | Grillot | ................ | H01L 33/0079 257/101 |
| 2001/0020703 A1* | 9/2001 | Gardner | .................. | H01L 33/02 257/87 |
| 2003/0003613 A1* | 1/2003 | Hsieh et al. | ........ | H01L 21/2007 438/22 |
| 2004/0144986 A1* | 7/2004 | Chen | ....................... | H01L 33/44 257/94 |
| 2008/0080580 A1* | 4/2008 | Takayama | ............ | H01S 5/4031 372/45.011 |
| 2011/0133155 A1* | 6/2011 | Yoon | ...................... | H01L 33/06 257/13 |

FOREIGN PATENT DOCUMENTS

| | | | | |
|---|---|---|---|---|
| EP | 2365546 A2 | | 9/2011 | |
| KR | 10-2015-0039375 | * | 4/2015 | ............. H01L 33/30 |
| KR | 10-1513803 | * | 4/2015 | ............. H01L 33/30 |
| TW | 201145586 A1 | | 12/2011 | |

OTHER PUBLICATIONS

E. Shibano et al., Liquid Phase Epitaxy of AlGaInP on GaAs Substrate Using AlGaAs Buffer Layer, 1993, Crystal Research Technology, vol. 28, No. 4, pp. 469-477.*
N. Takahashi et al., AlGaInP/AlGaAs double heterostructure light emitting diode grown by liquid phase epitaxy, 1994, Journal of Crystal Growth, vol. 137, pp. 240-244.*
Taiwanese Application No. 90115871, filed Jun. 27, 2001 (w-English translation), 42 pages.

* cited by examiner

*Primary Examiner* — Victoria K Hall
(74) *Attorney, Agent, or Firm* — Steptoe & Johnson LLP

(57) ABSTRACT

The present invention relates to a high-efficiency AlGaInP light-emitting diode directly grown on a transparent substrate and a method of manufacturing the same, and, more particularly, to a high-efficiency AlGaInP light-emitting diode grown on a sapphire substrate and a method of manufacturing the same. According to the present invention, an AlGaInP light-emitting diode is manufactured using an inexpensive sapphire substrate having high transmittance to ultraviolet rays, infrared rays and visible rays. The AlGaInP light-emitting diode according to the present invention can emit light with high efficiency because a lower substrate does not absorb light, and can be effectively manufactured because a process of removing a GaAs or a process of bonding a sapphire substrate is not conducted.

8 Claims, 1 Drawing Sheet

A.

HIGH-EFFICIENCY ALGAINP LIGHT-EMITTING DIODE GROWN DIRECTLY ON TRANSPARENT SUBSTRATE AND MANUFACTURING METHOD THEREOF

CLAIM FOR PRIORITY

This application claims priority to Korean Patent Application No. 10-2013-0117870, filed on Oct. 2, 2013.

BACKGROUND OF THE INVENTION

1. Technical Field

The present invention relates to a high-efficiency AlGaInP light-emitting diode directly grown on a transparent substrate and a method of manufacturing the same, and, more particularly, to a high-efficiency AlGaInP light-emitting diode grown on a sapphire substrate and a method of manufacturing the same.

2. Description of the Related Art

An AlGaInP light-emitting diode is used as a high-brightness light-emitting diode in a visible light region of 550~670 nm. The efficiency of an AlGaInP light-emitting diode with a GaAs substrate is very low because most of light emitted downward from diode was absorbed by the GaAs substrate.

Thus, an AS-LED (Absorbing Substrate LED) in which a DBR (distribution Bragg reflector) is provided on a GaAs substrate to reflect part of light emitted from the diode to the substrate was developed. However, this AS-LED is problematic in that the DBR is fabricated by a complicated procedure and light is reflected only at a predetermined angle.

Further, a method of manufacturing a light-emitting diode (LED) by removing a GaAs substrate using etching and then attaching a visible-light transmittable GaP substrate to the LED using wafer bonding was developed. However, this method is problematic in that an ESL (Etching Stop Layer) is needed in order to selectively etch a GaAs substrate and in that an LED is damaged by pressing during a wafer bonding procedure, thus increasing a defective fraction. Further, this method has a problem that a GaP substrate is expensive and thus economically inefficient.

SUMMARY OF THE INVENTION

Accordingly, the present invention has been devised to solve the above-mentioned problems, and an object of the present invention is to provide a novel AlGaInP light-emitting diode using a light-transmissive substrate and a manufacturing method thereof.

Another object of the present invention is to provide a novel AlGaInP light-emitting diode using a sapphire substrate and a manufacturing method thereof In order to accomplish the above objects, an aspect of the present invention provides an AlGaInP light-emitting diode, including: a sapphire substrate; an AlGaAs buffer layer disposed on the sapphire substrate; and an AlGaInP light-emitting unit disposed on the AlGaAs buffer layer.

In the present invention, the "AlGaInP light-emitting diode" is referred to as a diode including an AlGaInP light-emitting unit.

In the present invention, the "AlGaInP light-emitting unit" is referred to as a laminate which includes an AlGaInP active layer and lower and upper confining layers formed on both sides of the AlGaInP active layer and having a larger bandgap than the AlGaInP active layer.

In the present invention, the "transparency" means that light emitted from a diode is transmitted, and the "transmittance" means that light is transmitted at a rate of 50% or more with respect to a specific wavelength band.

In the present invention, the sapphire substrate is commercially available. The sapphire substrate may be surface-treated such that an AlGaAs buffer layer can be efficiently grown on the surface thereof by metalorganic chemical vapor deposition (MOCVD). Preferably, the sapphire substrate may be surface-treated with GaAs or AlGaAs (content of Al: 5% or less) to a light-transmittable thickness, wherein the GaAs or AlGaAs is applied on the surface of the sapphire substrate in the form of a thin film having a thickness of 10 nm or less, preferably, 30~70 nm.

In the present invention, the AlGaAs buffer layer is a substantially transparent buffer layer transmitting light emitted from the upper portion of the AlGaInP light-emitting unit. The AlGaAs buffer layer is represented by $Al_xGa_{1-x}As$ ($0.1 \leq x \leq 0.9$, preferably, $0.2 \leq x \leq 0.9$). When x is more than 0.9, there is a danger that the AlGaAs buffer layer can be oxidized and thus stripped.

According to an embodiment of the present invention, the AlGaAs is a buffer layer grown on the surface-treated sapphire substrate. Preferably, the AlGaAs buffer layer may be grown to a thickness of 500 nm to several micrometers by metalorganic chemical vapor deposition (MOCVD).

Another aspect of the present invention provides an AlGaInP light-emitting diode, including: a transparent sapphire substrate; an AlGaAs buffer layer formed on the transparent sapphire substrate; and a light-emitting unit formed on the AlGaAs buffer layer.

According to an embodiment of the present invention, the light-emitting unit is configured such that lower and upper confining layers, each having a larger bandgap than an active layer, are formed on both sides of the active layer. The active layer may be composed of AlGaInP. In order to increase luminance efficiency, the light-emitting unit may be formed on the surface thereof with commonly known window layers.

According to an embodiment of the present invention, the light-emitting diode includes: a transparent sapphire substrate; a $Al_xGa_{1-x}As$ ($0.1 \leq x \leq 0.9$) buffer layer formed on the sapphire substrate; an n-cladding layer formed on the buffer layer; an active layer formed on the n-cladding layer; a p-cladding layer formed on the active layer; and a p-gap layer formed on the p-cladding layer, wherein the active layer is represented by $(Al_xGa_{1-x})_{1-y}In_yP$ ($0 \leq x \leq 1$, $0.5 \leq y \leq 0.6$), and each of the cladding layers is composed of AlGaInP.

According to an embodiment of the present invention, since the sapphire substrate is an insulating substrate, the light-emitting diode may be configured such that the n-cladding layer disposed on the sapphire substrate is etched to be exposed, and an electrode is formed on the exposed surface thereof.

BRIEF DESCRIPTION OF THE DRAWINGS

The above and other objects, features and advantages of the present invention will be more clearly understood from the following detailed description taken in conjunction with the accompanying drawings, in which.

REFERENCE NUMERALS

Figure 1:
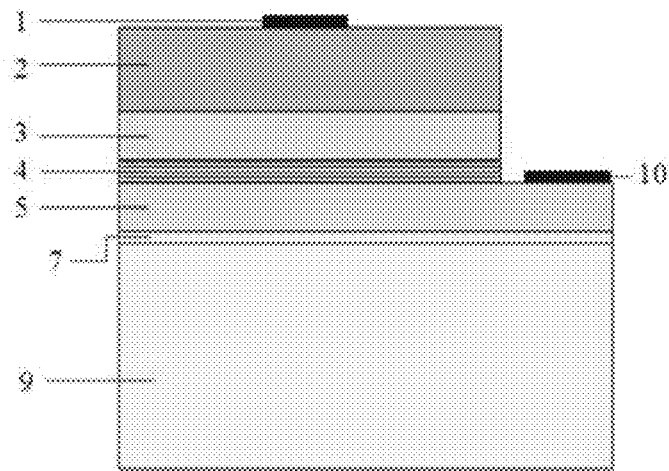
FIG. 1 is a schematic view showing a structure of a $(Al_xGa_{1-x})_{1-y}In_yP$ light-emitting diode directly grown on a transparent substrate according to the present invention.

1: upper electrode
2: window layer
3: p-type confining layer
4: active layer
5: n-type confining layer
7: buffer layer
9: sapphire substrate
10: lower electrode

DESCRIPTION OF THE PREFERRED EMBODIMENTS

Hereinafter, preferred embodiments of the present invention will be described in detail with reference to the attached drawings. In the description of the present invention when it is determined that the detailed description of the related art would obscure the gist of the present invention the description thereof will be omitted.

The present invention provides an AlGaInP light-emitting diode, including: a sapphire substrate; an AlGaAs buffer layer disposed on the sapphire substrate; and an AlGaInP light-emitting unit disposed on the AlGaAs buffer layer.

In the present invention, each of the layers of the light-emitting diode may be grown by metalorganic vapor phase epitaxy (MOVPE), molecular beam epitaxy (MBE), metalorganic chemical vapor deposition (MOCVD) or the like. Basically, each of the layers thereof is grown into an expitaxial layer.

As shown in FIG. 1, a sapphire substrate 9, which is transparent to AlGaInP-emitted light, may be used in the present invention. For example, an n-type sapphire substrate 9 having a thickness of 350~450 μm may be used.

An AlGaAs buffer layer 7 is formed on the sapphire substrate 9. The AlGaAs buffer layer 7 was formed as follows. First, the sapphire substrate 9 was put into a temperature-controllable chamber, and then a GaAs layer was formed to a thickness of 30 nm on the surface of the sapphire substrate 9 using metalorganic chemical vapor deposition (MOCVD) while increasing the temperature of the chamber to 600° C. at a predetermined heating rate. Then, the temperature of the chamber was lowered to 500° C. and then maintained for about 20 minutes, thus obtaining a transparent sapphire substrate 9 surface-treated with GaAs.

Figure 2:
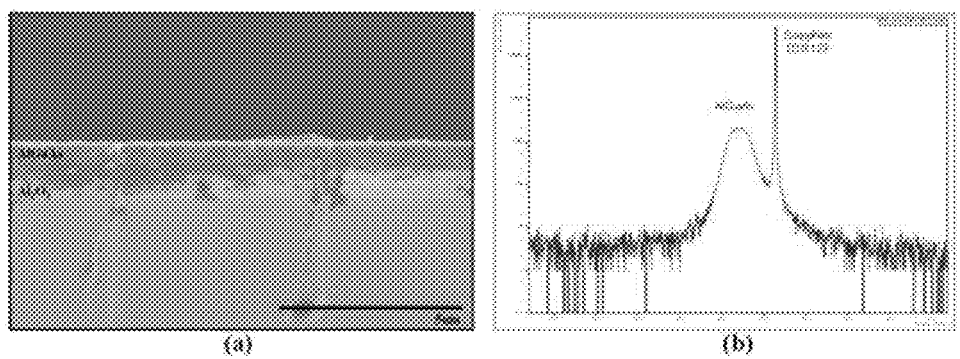
FIG. 2 shows the results of analysis of a n-type AlGaAs buffer layer formed on a n-type sapphire substrate essentially necessary for fabricating the $(Al_xGa_{1-x})_{1-y}In_yP$ light-emitting diode of FIG. 1.

Subsequently, the temperature of the chamber was increased to 650° C., and then an AlGaAs layer was formed to a thickness of 500 nm on the surface of the GaAs layer using metalorganic chemical vapor deposition (MOCVD). Then, the sapphire substrate provided with the AlGaAs layer was cooled to room temperature, and was then taken out from the chamber, thereby forming a buffer layer 7 on the sapphire substrate 9. As shown in FIG. 2, the section of the formed buffer layer 7 was analyzed using scanning electron microscopy (SEM), thus ascertaining whether the buffer layer was formed on the sapphire substrate 9 to an appropriate thickness.

Luminescent layers may be formed on the buffer layer 7. Specifically, first, an n-type $(Al_xGa_{1-x})_{0.5}In_{0.5}P$ confining layer 5 was grown on the buffer layer 7. This n-type confining layer 5 may have a thickness of 2~3 μm.

An active layer for emitting light using electron-hole combination, for example, an n-doped $(Al_yGa_{1-y})_{0.5}In_{0.5}P$ active layer 4 may be grown on the n-type $(Al_xGa_{1-x})_{0.5}In_{0.5}P$ confining layer 5 to a thickness of 500~600 nm. This active layer 4 may have a double heterostructure or multi-quantum structure in order to effectively confine a carrier.

A p-type $(Al_zGa_{1-z})_{0.5}In_{0.5}P$ confining layer 3 having thickness equal to or similar to that of the n-type confining layer 5 is grown on the active layer 4. Then, a GaP window layer 2 is grown on the p-type confining layer 3 at 400° C. or lower by vacuum deposition such as metalorganic chemical vapor deposition (MOCVD), molecular beam epitaxy (MBE) or the like. The window layer 2 may have a thickness of 3 μm or more.

Subsequently, after the GaP window layer 2, the p-type confining layer 3 and the active layer 4 were etched such that part of the n-type confining layer 5 is exposed, an upper electrode 1 is formed on the GaP window layer 2, and a lower electrode 10 is formed on the exposed surface of the n-type confining layer 5, thus finally completing a light-emitting diode employing a buffer layer according to the present invention.

According to an embodiment of the present invention, a p-type electrode layer may be made of an Au—Zn alloy or an Au—Be alloy, and an n-type electrode layer may be made of an Au—Ge—Ni alloy. Further, the relation among x, y and z may be $0 \leq y \leq 0.7$, $y \leq x$ and $y \leq z$. Hereinafter, the $(Al_xGa_{1-x})_{0.5}In_{0.5}P$, $(Al_yGa_{1-y})_{0.5}In_{0.5}P$ and $(Al_zGa_{1-z})_{0.5}In_{0.5}P$ will be commonly referred to as "AlGaInP" as long as they are particularly distinguished from each other. The stoichiometric amount of the above-mentioned $(Al_xGa_{1-x})_{0.5}In_{0.5}P$ is only one embodiment of the present invention, and various systems can be applied depending on the wavelength of light to be output.

As described above, the AlGaInP light-emitting diode according to the present invention can be manufactured using an inexpensive sapphire substrate having high transmittance to ultraviolet rays, infrared rays and visible rays.

The AlGaInP light-emitting diode according to the present invention can emit light with high efficiency because a lower substrate does not absorb light, and can be effectively manufactured because a process of removing a GaAs or a process of bonding a sapphire substrate is not conducted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An AlGaInP light-emitting diode, comprising:
a sapphire substrate;
an AlGaAs buffer layer grown on the sapphire substrate; and
an AlGaInP light-emitting unit grown on the AlGaAs buffer layer, wherein a surface of the sapphire substrate is coated with GaAs or AlGaAs (content of Al: 5% or less) to a light-transmittable thickness.

2. The AlGaInP light-emitting diode of claim 1, wherein the GaAs or AlGaAs is applied on the surface of the sapphire substrate in the form of a thin film having a thickness of 30~70 nm.

3. The AlGaInP light-emitting diode of claim 1, wherein the AlGaAs buffer layer is represented by AlxGa1-xAs ($0.1 \leq x \leq 0.9$).

4. The AlGaInP light-emitting diode of claim 1, wherein the AlGaAs buffer layer is grown by metalorganic chemical vapor deposition (MOCVD).

5. The AlGaInP light-emitting diode of claim 1, wherein the AlGaAs buffer layer is a n-type, p-type or undoped buffer layer.

6. The AlGaInP light-emitting diode of claim 1, wherein the AlGaInP light-emitting unit comprises: an AlGaInP active layer; and lower and upper confining layers formed on both sides of the AlGaInP active layer and having a larger bandgap than the AlGaInP active layer.

7. The AlGaInP light-emitting diode of claim 6, wherein the AlGaInP active layer is represented by $(Al_xGa_{1-x})_{1-y}In_yP$ ($0 \leq x \leq 1$, $0.5 \leq y \leq 0.6$).

8. The AlGaInP light-emitting diode of claim 6, wherein the lower confining layer is partially exposed, and is provided thereon with a lower electrode.

* * * * *